(12) United States Patent
Jiang et al.

(10) Patent No.: US 10,284,005 B2
(45) Date of Patent: May 7, 2019

(54) POWER SUPPLY ASSEMBLY AND ELECTRONIC DEVICE

(71) Applicant: BOE Technology Group Co., Ltd., Beijing (CN)

(72) Inventors: Feng Jiang, Beijing (CN); Long Wang, Beijing (CN); Li Zhou, Beijing (CN); Xingdong Liu, Beijing (CN); Ke Liu, Beijing (CN); Xuan He, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 38 days.

(21) Appl. No.: 15/532,010

(22) PCT Filed: Sep. 26, 2016

(86) PCT No.: PCT/CN2016/100151
§ 371 (c)(1),
(2) Date: May 31, 2017

(87) PCT Pub. No.: WO2017/128751
PCT Pub. Date: Aug. 3, 2017

(65) Prior Publication Data
US 2018/0069427 A1 Mar. 8, 2018

(30) Foreign Application Priority Data
Jan. 27, 2016 (CN) .......................... 2016 1 0055608

(51) Int. Cl.
H02J 7/35 (2006.01)
H01L 31/053 (2014.01)
(Continued)

(52) U.S. Cl.
CPC .............. *H02J 7/35* (2013.01); *H01L 31/053* (2014.12); *H02J 7/345* (2013.01); *H02S 40/38* (2014.12); *Y02E 10/566* (2013.01)

(58) Field of Classification Search
CPC .. H02J 7/35; H02J 7/345; H02S 40/38; H01L 31/053
(Continued)

(56) References Cited

U.S. PATENT DOCUMENTS 3,089,070 A * 5/1963 Ralph ................... H01L 31/068
136/255
5,600,225 A * 2/1997 Goto ...................... H02J 7/0004
320/108

(Continued)

FOREIGN PATENT DOCUMENTS

CN 1639816 A 7/2005
CN 101180692 A 5/2008
(Continued)

OTHER PUBLICATIONS

Oct. 9, 2017—(CN) Office Action application CN 201610055608.3 with English Translation.
(Continued)

*Primary Examiner* — Sun J Lin
(74) *Attorney, Agent, or Firm* — Banner & Witcoff, Ltd.

(57) ABSTRACT

A power supply assembly and an electronic device are disclosed. The power supply assembly includes a photoelectric converting element, a storage capacitor, an energy storage battery and an energy management module. The energy management module is configured to control the photoelectric converting element to charge the storage capacitor and the energy storage battery and control the storage capacitor to charge the energy storage battery. The power supply assembly can provide power stably in a longer term.

18 Claims, 4 Drawing Sheets

(51) Int. Cl.
*H02S 40/38* (2014.01)
*H02J 7/34* (2006.01)

(58) Field of Classification Search
USPC .......................................................... 320/101
See application file for complete search history.

(56) References Cited

U.S. PATENT DOCUMENTS

| | | | | |
|---|---|---|---|---|
| 8,120,331 | B2* | 2/2012 | Takahashi et al. | G03G 15/80 |
| | | | | 320/101 |
| 8,134,332 | B2* | 3/2012 | Lin et al. | H02J 7/355 |
| | | | | 320/101 |
| 8,664,910 | B2* | 3/2014 | Yamada | G06F 3/0202 |
| | | | | 320/101 |
| 2004/0161640 | A1 | 8/2004 | Salot | |
| 2009/0160579 | A1 | 6/2009 | Serikawa et al. | |
| 2015/0130395 | A1 | 5/2015 | Rice | |
| 2017/0070180 | A1* | 3/2017 | Mills | G21H 1/12 |

FOREIGN PATENT DOCUMENTS

| | | |
|---|---|---|
| CN | 101383019 A | 3/2009 |
| CN | 101989493 A | 3/2011 |
| CN | 102683443 A | 9/2012 |
| CN | 102810407 A | 12/2012 |
| CN | 103066209 A | 4/2013 |
| CN | 103139936 A | 6/2013 |
| CN | 103413694 A | 11/2013 |
| CN | 102347518 B | 1/2014 |
| CN | 204271201 U | 4/2015 |
| CN | 105186606 A | 12/2015 |
| CN | 105515164 A | 4/2016 |

OTHER PUBLICATIONS

Dec. 30, 2016—(WO) International Search Report and Written Opinion Appn PCT/CN2016/100151 with English Tran.

* cited by examiner

POWER SUPPLY ASSEMBLY AND ELECTRONIC DEVICE

The application is a U.S. National Phase Entry of International Application No. PCT/CN2016/100151 filed on Sep. 26, 2016, designating the United States of America and claiming priority to Chinese Patent Application No. 201610055608.3, filed with China's State Intellectual Property Office (SIPO) on Jan. 27, 2016. The present application claims priority to and the benefit of the above-identified applications and the above-identified applications are incorporated by reference herein in their entirety.

TECHNICAL FIELD

Embodiments of the present disclosure relate to a power supply assembly and an electronic device.

BACKGROUND

With the acceleration of development of the Internet of things, the requirement on terminal sensors is higher and higher. The conventional sensor is generally bulky and inconvenient in use. The future sensors will be developed towards miniaturization, thin-film design and unmanaged state. The development trend requires a power supply system of the sensor to meet two characteristics of light and thin design, and perdurability, and a power supply assembly capable of being matched with the sensor is required.

SUMMARY

Embodiments of the present disclosure provide a power supply assembly. The power supply assembly comprises a photoelectric converting element, a storage capacitor, an energy storage battery and an energy management module. The energy management module is configured to control the photoelectric converting element to charge the storage capacitor and the energy storage battery, and control the storage capacitor to charge the energy storage battery.

For example, the energy management module comprises a detecting unit, a first switching unit, a second switching unit, a third switching unit and a control unit.

The detecting unit is configured to detect an output voltage of the photoelectric converting element and a dump energy of the storage capacitor and the energy storage battery.

The control unit is configured to control the photoelectric converting element to charge the energy storage battery through the first switching unit when the output voltage of the photoelectric converting element is greater than a first default value and the dump energy of the energy storage battery is less than a second default value, control the photoelectric converting element to charge the storage capacitor through the second switching unit when the output voltage of the photoelectric converting element is greater than the first default value and the dump energy of the storage capacitor is less than a third default value, and control the storage capacitor to charge the energy storage battery through the third switching unit when the power of the storage capacitor is greater than a fourth default value and the dump energy of the energy storage battery is less than the second default value, in which the fourth default value is less than the third default value.

For example, anodes of the photoelectric converting element comprise a first anode and a second anode which are insulated from each other, and cathodes of the photoelectric converting element comprise a first cathode and a second cathode which are insulated from each other.

Anodes of the storage capacitor comprise a third anode and a fourth anode which are insulated from each other, and cathodes of the storage capacitor comprise a third cathode and a fourth cathode which are insulated from each other.

Anodes of the energy storage battery comprise a fifth anode and a sixth anode which are insulated from each other, and cathodes of the energy storage battery comprise a fifth cathode and a sixth cathode which are insulated from each other.

The first switching unit is configured to control at least one of on-off action between the first anode and the fifth cathode, or on-off action between the first cathode and the fifth anode; the second switching unit is configured to control at least one of on-off action between the second anode and the fourth cathode, or on-off action between the second cathode and the fourth anode; and the third switching unit is configured to control at least one of on-off action between the third anode and the sixth cathode, or on-off action between the third cathode and the sixth anode.

For example, the photoelectric converting element comprises a p-type semiconductor layer, an n-type semiconductor layer, and an i-type semiconductor layer disposed between the p-type semiconductor layer and the n-type semiconductor layer; the first anode and the second anode are disposed on a side of the n-type semiconductor layer away from the i-type semiconductor layer; and the first cathode and the second cathode are disposed on a side of the p-type semiconductor layer away from the i-type semiconductor layer.

For example, the first anode and the second anode are respectively comb-shaped and intersected with each other, and the first cathode and the second cathode are respectively comb-shaped and intersected with each other.

For example, the storage capacitor comprises a first electrolyte layer; the third anode and the fourth anode are disposed on a side of the first electrolyte layer; and the third cathode and the fourth cathode are disposed on the other side of the first electrolyte layer.

For example, the third anode and the fourth anode are respectively comb-shaped and intersected with each other; and the third cathode and the fourth cathode are respectively comb-shaped and intersected with each other.

For example, the energy storage battery comprises a second electrolyte layer; the fifth anode and the sixth anode are disposed on a side of the second electrolyte layer; and the fifth cathode and the sixth cathode are disposed on the other side of the second electrolyte layer.

For example, the fifth anode and the sixth anode are respectively comb-shaped and intersected with each other; and the fifth cathode and the sixth cathode are respectively comb-shaped and intersected with each other.

For example, the power supply assembly further comprises a base substrate, the photoelectric converting element, the storage capacitor and the energy storage battery being disposed on the base substrate.

For example, the photoelectric converting element, the storage capacitor and the energy storage battery are disposed on each other on the base substrate.

For example, the energy storage battery, the storage capacitor and the photoelectric converting element are disposed on the base substrate in sequence.

For example, an insulating layer is disposed between the energy storage battery and the storage capacitor, and between the storage capacitor and the photoelectric converting element.

For example, the photoelectric converting element, the storage capacitor and the energy storage battery are disposed in a same layer on the base substrate.

Embodiments of the present disclosure also provide an electronic device, comprising the power supply assembly.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which.

DETAILED DESCRIPTION

Figure 1:
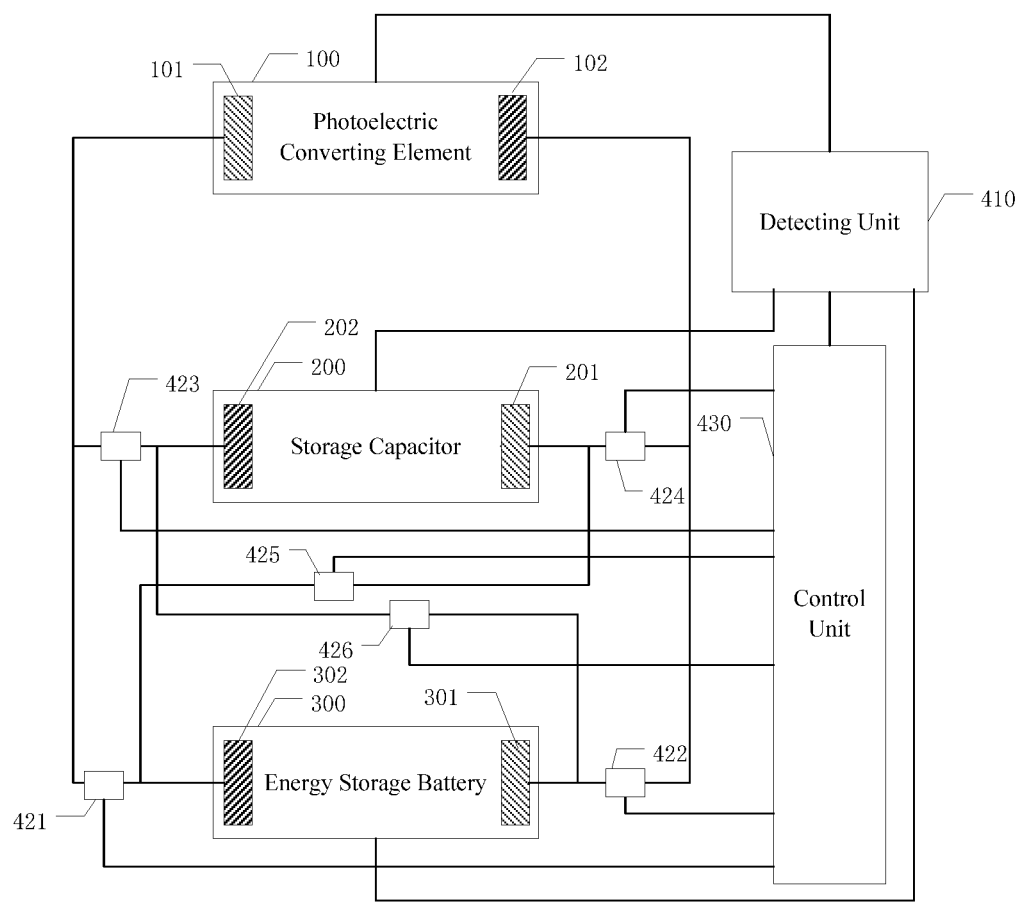
FIG. 1 is a schematic diagram of a first power supply assembly provided by an embodiment of the present disclosure.

Technical solutions according to the embodiments of the present disclosure will be described clearly and fully as below in conjunction with the accompanying drawings of embodiments of the present disclosure. It is apparent that the described embodiments are just a part but not all of the embodiments of the disclosure. Based on the described embodiments herein, a person of ordinary skill in the art can obtain other embodiment(s), without any creative work, which shall be within the scope of the present disclosure.

The embodiment of the present disclosure provides a power supply assembly. The power supply assembly comprises a photoelectric converting element, a storage capacitor, an energy storage battery and an energy management module. The energy management module is configured to control the photoelectric converting element to charge the storage capacitor and the energy storage battery, and control the storage capacitor to charge the energy storage battery.

The power supply assembly provided by the embodiment of the present disclosure comprises the photoelectric converting element, the storage capacitor and the energy storage battery. Under the control of the energy management module, the photoelectric converting element may convert received optical energy (e.g., sunlight) into electric energy, and the electric energy obtained after conversion not only can supply power for electrical parts but also can charge the storage capacitor and the energy storage battery. In addition, when the photoelectric converting element cannot operate (e.g., in rainy weather or at night), the storage capacitor may charge the energy storage battery while supplying power for the electrical parts, so as to achieve the long-term and stable power supply for the electrical parts.

For instance, the energy management module may include a detecting unit, a first switching unit, a second switching unit, a third switching unit and a control unit.

The detecting unit is configured to detect the output voltage of the photoelectric converting element and the dump energy of the storage capacitor and the energy storage battery.

The control unit is configured to control the photoelectric converting element to charge the energy storage battery through the first switching unit when the output voltage of the photoelectric converting element is greater than a first default value and the dump energy of the energy storage battery is less than a second default value, control the photoelectric converting element to charge the storage capacitor through the second switching unit when the output voltage of the photoelectric converting element is greater than the first default value and the dump energy of the storage capacitor is less than a third default value, and control the storage capacitor to charge the energy storage battery through the third switching unit when the power of the storage capacitor is greater than a fourth default value and the dump energy of the energy storage battery is less than the second default value, in which the fourth default value is less than the third default value.

As illustrated in FIG. 1 which is a schematic diagram of a power supply assembly provided by the embodiment of the present disclosure, the power supply assembly comprises a photoelectric converting element 100, a storage capacitor 200, an energy storage battery 300 and an energy management module.

The energy management module may include a detecting unit 410, a first switching unit, a second switching unit, a third switching unit and a control unit 430. The first switching unit includes a switching element 421 configured to control the on-off action between an anode 101 of the photoelectric converting element 100 and a cathode 302 of the energy storage battery, and a switching element 422 configured to control the on-off action between a cathode 102 of the photoelectric converting element 100 and an anode 301 of the energy storage battery; the second switching unit includes a switching element 423 configured to control the on-off between the anode 101 of the photoelectric converting element 100 and a cathode 202 of the storage capacitor, and a switching element 424 configured to control the on-off between the cathode 102 of the photoelectric converting element 100 and an anode 201 of the storage capacitor; and the third switching unit includes a switching element 425 configured to control the on-off between the anode 201 of the storage capacitor and the cathode 302 of the energy storage battery, and a switching element 426 configured to control the on-off between the cathode 202 of the storage capacitor and the anode 301 of the energy storage battery.

In the above power supply assembly, when the detecting unit detects that the output voltage of the photoelectric converting element is greater than a first default value and the dump energy of the energy storage battery is less than a second default value, the switching element 421 and the switching element 422 can be controlled to be switched on, so that the photoelectric converting element can begin to charge the energy storage battery; when the detecting unit detects that the output voltage of the photoelectric converting element is greater than the first default value and the dump energy of the storage capacitor is less than a third default value, the switching element 423 and the switching element 424 can be controlled to be switched on, so that the photoelectric converting element can begin to charge the storage capacitor; and when the power of the storage capacitor is greater than a fourth default value and the dump energy of the energy storage battery is less than the second default value, the switching element 421, the switching element 422, the switching element 423 and the switching element 424 can be controlled to be switched off, meanwhile, the switching element 425 and the switching element 426 can be controlled to be switched on, so that the storage capacitor can begin to charge the energy storage battery. For instance, in rainy weather or at night, the output voltage of the photoelectric converting element is less than or equal to the first default value, so the photoelectric converting element is determined to fail to work, then the switching element 421, the switching element 422, the switching element 423 and the switching element 424 can be controlled to be switched off; meanwhile, if the detecting unit detects that the power of the storage capacitor is greater than the fourth default value and the dump energy of the energy storage battery is less than the second default value, the switching element 425 and the switching element 426 can be controlled to be switched on, so that the storage capacitor can begin to charge the energy storage battery.

For instance, for the photoelectric converting element, the storage capacitor and the energy storage battery to be able to operate simultaneously, the above three power supply devices may respectively include a plurality of groups of anode and cathode interfaces.

For instance, anodes of the photoelectric converting element may include a first anode and a second anode which are insulated from each other, and cathodes of the photoelectric converting element may include a first cathode and a second cathode which are insulated from each other.

Anodes of the storage capacitor may include a third anode and a fourth anode which are insulated from each other, and cathodes of the storage capacitor may include a third cathode and a fourth cathode which are insulated from each other.

Anodes of the energy storage battery may include a fifth anode and a sixth anode which are insulated from each other, and cathodes of the energy storage battery may include a fifth cathode and a sixth cathode which are insulated from each other.

The first switching unit is configured to control at least one of the on-off between the first anode and the fifth cathode, or the on-off between the first cathode and the fifth anode; the second switching unit is configured to control at least one of the on-off between the second anode and the fourth cathode, or the on-off between the second cathode and the fourth anode; and the third switching unit is configured to control at least one of the on-off between the third anode and the sixth cathode, or the on-off between the third cathode and the sixth anode.

Figure 2:
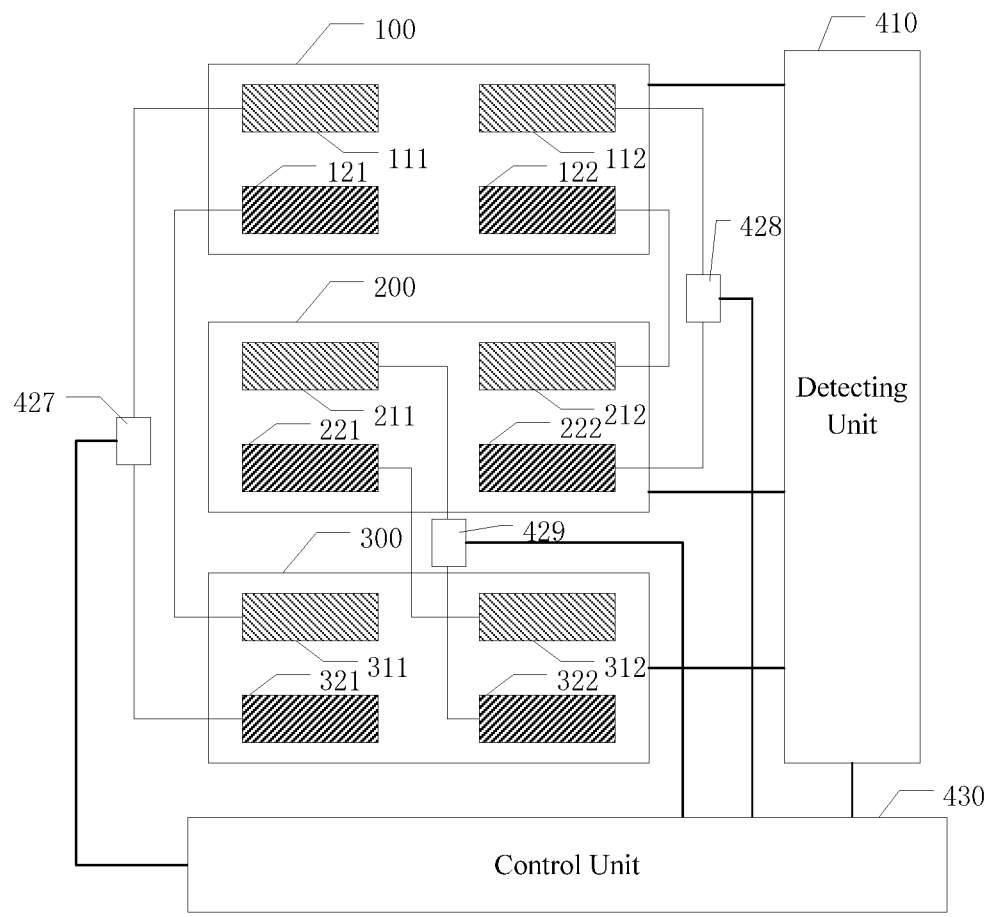
FIG. 2 is a schematic diagram of a second power supply assembly provided by an embodiment of the present disclosure.

As illustrated in FIG. 2 which is a schematic diagram of a second power supply assembly provided by the embodiment of the present disclosure, the power supply assembly comprises a photoelectric converting element 100, a storage capacitor 200, an energy storage battery 300 and an energy management module.

The photoelectric converting element 100 includes a first anode 111 and a second anode 112 which are insulated from each other, and a first cathode 121 and a second cathode 122 which are insulated from each other.

The storage capacitor 200 includes a third anode 211 and a fourth anode 212 which are insulated from each other, and a third cathode 221 and a fourth cathode 222 which are insulated from each other.

The energy storage battery 300 includes a fifth anode 311 and a sixth anode 312 which are insulated from each other, and a fifth cathode 321 and a sixth cathode 322 which are insulated from each other.

The first cathode 121 is electrically connected with the fifth anode 311; the second cathode 122 is electrically connected with the fourth anode 212; and the third cathode 221 is electrically connected with the sixth anode 312.

The energy management module includes a detecting unit 410, a first switching unit, a second switching unit, a third switching unit and a control unit 430. The first switching unit includes a switching element 427 configured to control the on-off between the first anode 111 and the fifth cathode 321; the second switching unit includes a switching element 428 configured to control the on-off between the second anode 112 and the fourth cathode 222; and the third switching unit includes a switching element 429 configured to control the on-off between the third anode 211 and the sixth cathode 322.

In the power supply assembly provided by the embodiment of the present disclosure, received optical energy (e.g., sunlight) can be converted into electric energy by the photoelectric converting element, and the electric energy obtained after conversion not only can supply power for electrical parts but also can charge the storage capacitor and the energy storage battery. When the photoelectric converting element cannot operate (e.g., in rainy weather or at night), the fully charged storage capacitor may charge the energy storage battery while supplying power for the electrical parts. After the storage capacitor is completely discharged, the energy storage battery continue to supply power for the electrical parts until the photoelectric converting element can operate again, so as to achieve the long-term and stable power supply for the electrical parts.

For instance, when the detecting unit detects that the output voltage of the photoelectric converting element is greater than a first default value and the dump energy of the energy storage battery is less than a second default value, the switching element 427 may be controlled to be switched on, so that the photoelectric converting element can begin to charge the energy storage battery; when the detecting unit detects that the output voltage of the photoelectric converting element is greater than the first default value and the dump energy of the storage capacitor is less than a third default value, the switching element 428 may be controlled to be switched on, so that the photoelectric converting element can begin to charge the storage capacitor; and when the power of the storage capacitor is greater than a fourth default value and the dump energy of the energy storage battery is less than the second default value, the switching element 429 may be controlled to be switched on, so that the storage capacitor can begin to charge the energy storage battery. In the power supply assembly provided by the embodiment of the present disclosure, the storage capacitor may also charge the energy storage battery at the same time when the photoelectric converting element charges the storage capacitor and the energy storage battery.

In the embodiment of the present disclosure, the photoelectric converting element, the storage capacitor and the energy storage battery may adopt a thin-film structure, so as to reduce the volume of the power supply assembly and realize light and thin design.

Figure 3:
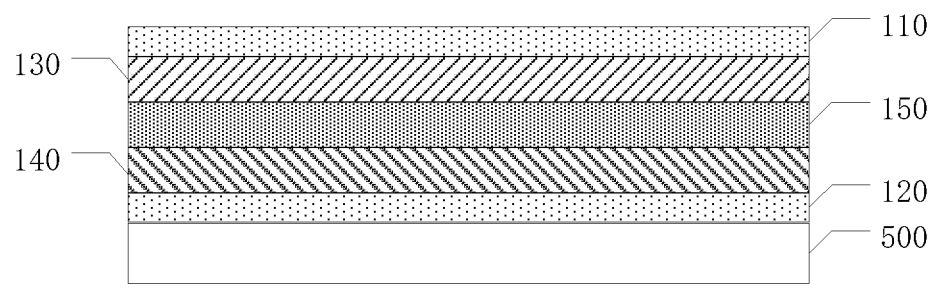
FIG. 3 is a schematic diagram of a photoelectric converting element in an embodiment of the present disclosure.

For instance, the photoelectric converting element in the power supply assembly provided by the embodiment of the present disclosure may be a thin-film solar cell, the structure of which may be as shown in FIG. 3. The photoelectric converting element includes an anode layer 110 (as anodes of the photoelectric converting element), a cathode layer 120 (as cathodes of the photoelectric converting element), and a PIN-type semiconductor layer disposed between the anode layer 110 and the cathode layer 120, disposed on a base substrate 500.

The anode layer 110 and the cathode layer 120 may be made from metallic materials (such as aluminum (Al)) and may also be made from transparent conductive materials (such as indium tin oxide (ITO)). For instance, for the photoelectric converting element in the power supply assembly as shown in FIG. 2, the anode layer 110 includes a first anode 111 and a second anode 112 which are insulated from each other, and the cathode layer 120 includes a first cathode 121 and a second cathode 122 which are insulated from each other. The PIN-type semiconductor layer is doped and un-doped amorphous silicon (a-Si) and includes a p-type semiconductor layer 140, an n-type semiconductor layer 130 and an i-type semiconductor layer 150 disposed between the p-type semiconductor layer 140 and the n-type semiconductor layer 130. The first anode and the second anode are disposed on a side of the n-type semiconductor layer away from the i-type semiconductor layer, and the first cathode and the second cathode are disposed on a side of the p-type semiconductor layer away from the i-type semiconductor layer. The thickness of the anode layer 110 and the cathode layer 120 may be 100-500 nm; the thickness of the p-type semiconductor layer 140 may be 1,000-2,000 nm; the thickness of the i-type semiconductor layer 150 may be 100-200 nm; and the thickness of the n-type semiconductor layer 130 may be 100-200 nm.

Figure 4:
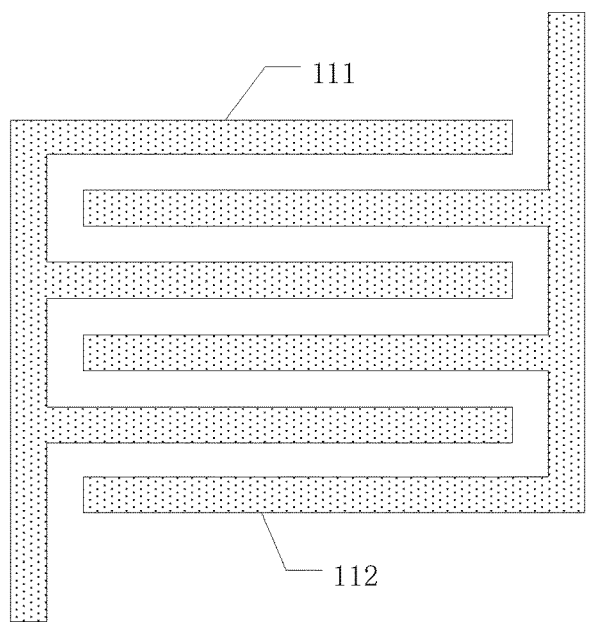
FIG. 4 is a schematic diagram of an anode layer of a photoelectric converting element in an embodiment of the present disclosure.
Figure 5:
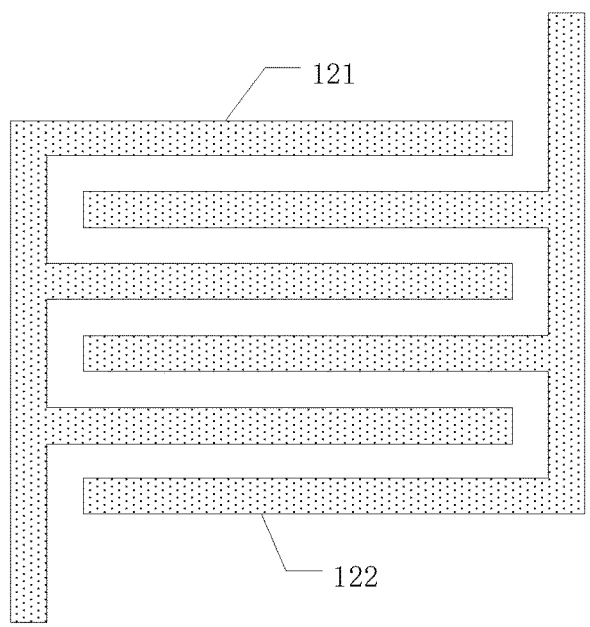
FIG. 5 is a schematic diagram of a cathode layer of a photoelectric converting element in an embodiment of the present disclosure.

The photoelectric converting element may form two groups of independent cathode and anode interfaces through the first anode 111 and the second anode 112 which are insulated from each other, and the first cathode 121 and the second cathode 122 which are insulated from each other, and may respectively charge the storage capacitor, and the energy storage battery through the two groups of independent cathode and anode interfaces. For instance, the anode layer 110 may be as shown in FIG. 4, and the first anode 111 and the second anode 112 are respectively comb-shaped and intersected with each other. The cathode layer 120 may be as shown in FIG. 5, and the first cathode 121 and the second cathode 122 are respectively comb-shaped and intersected with each other. The effective active area of each cathode or anode may be improved by setting the double cathodes and the double anodes of the photoelectric converting element to be finger-crossed patterns.

Figure 6:
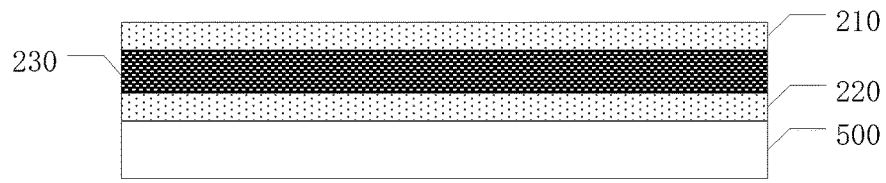
FIG. 6 is a schematic diagram of a storage capacitor in an embodiment of the present disclosure.

For instance, the storage capacitor in the power supply assembly provided by the embodiment of the present disclosure may be a thin-film supercapacitor, the structure of which may be as shown in FIG. 6. The storage capacitor includes an anode layer 210, a cathode layer 220 and a first electrolyte layer 230 disposed on the base substrate 500. The materials of the anode layer 210 and the cathode layer 220 may be metallic materials (such as Al) with good electrical conductivity and may also be transparent conductive materials (such as ITO). For instance, for the storage capacitor in the power supply assembly as shown in FIG. 2, the anode layer 210 includes a third anode 211 and a fourth anode 212 which are insulated from each other; the cathode layer 220 includes a third cathode 221 and a fourth cathode 222 which are insulated from each other; the third anode 211 and the fourth anode 212 are disposed on a side of the first electrolyte layer 230; and the third cathode 221 and the fourth cathode 222 are disposed on the other side of the first electrolyte layer 230. Electrolyte in the first electrolyte layer 230 may be Lead Tungstate doped $Al_2O_3$ or other materials with high dielectric constant. The thickness of the anode layer 210 and the cathode layer 220 may be 100-500 nm. The thickness of the first electrolyte layer 230 may be 500-2,000 nm.

The storage capacitor may form two groups of independent cathode and anode interfaces through the third anode 211 and the fourth anode 212 which are insulated from each other, and the third cathode 221 and the fourth cathode 222 which are insulated from each other. The storage capacitor may be charged by the photoelectric converting element through the two groups of independent cathode and anode interfaces, and charges the energy storage battery when the photoelectric converting element fails to work. For instance, the anode layer 210 and the cathode layer 220 of the storage capacitor may also adopt the structure the same as that of the anode layer and the cathode layer of the photoelectric converting element (namely the electrode shape in FIGS. 4 and 5). The third anode 211 and the fourth anode 212 are respectively comb-shaped and intersected with each other, and the third cathode 221 and the fourth cathode 222 are respectively comb-shaped and intersected with each other.

Figure 7:
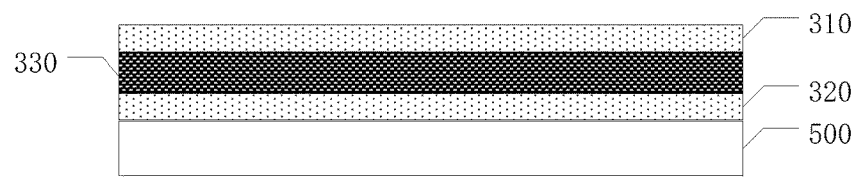
FIG. 7 is a schematic diagram of an energy storage battery in an embodiment of the present disclosure.

For instance, the energy storage battery in the power supply assembly provided by the embodiment of the present disclosure may be a solid state thin-film lithium ion battery, the structure of which may be as shown in FIG. 7. The energy storage battery includes an anode layer 310, a cathode layer 320 and a second electrolyte layer 330 disposed on the base substrate 500. The cathode layer 320 may be made from $LiCoO_2$, $LiMn_2O_4$, CoNOx or $LiFePO_4$, and the anode layer 310 may be made from Li, Sn3N4, graphite, graphene, carbon nanotubes (CNT), silver nanowires, or the like. For instance, for the energy storage battery in the power supply assembly as shown in FIG. 2, the anode layer 310 may include a fifth anode 311 and a sixth anode 312 which are insulated from each other; the cathode layer 320 may include a fifth cathode 321 and a sixth cathode 322 which are insulated from each other; the fifth anode 311 and the sixth anode 312 are disposed on a side of the second electrolyte layer; and the fifth cathode 321 and the sixth cathode 322 are disposed on the other side of the second electrolyte layer. The electrolyte material in the second electrolyte layer 330 may be LiPON or Li—P—W—O—N material system. The thickness of the anode layer 310 and the cathode layer 320 may be 100-500 nm. The thickness of the second electrolyte layer 330 may be 200-1,000 nm.

The energy storage battery may form two groups of independent cathode and anode interfaces through the fifth anode 311 and the sixth anode 312 which are insulated from each other, and the fifth cathode 321 and the sixth cathode 322 which are insulated from each other, and may respectively be charged by the photoelectric converting element and the storage capacitor through the two groups of independent cathode and anode interfaces. For instance, the anode layer 310 and the cathode layer 320 of the energy storage battery may also adopt the structure the same as that of the anode layer and the cathode layer of the photoelectric converting element (namely the electrode shape in FIGS. 4 and 5). The fifth anode 311 and the sixth anode 312 are respectively comb-shaped and intersected with each other, and the fifth cathode 321 and the sixth cathode 322 are respectively comb-shaped and intersected with each other.

In the embodiment of the present disclosure, the thickness of materials in layers of the photoelectric converting element, the storage capacitor and the energy storage battery may be determined according to device design, and the preparing process of the layers may adopt processes, such as sputtering depositing, solution depositing (spin-coating, printing, or the like) and chemical vapor depositing process (CVD).

Figure 8:
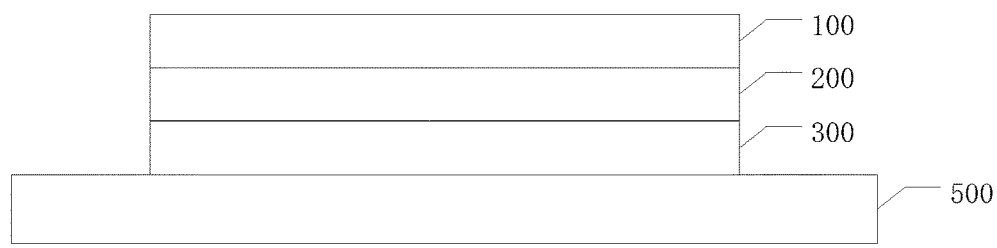
FIG. 8 is a schematic diagram of a third power supply assembly provided by an embodiment of the present disclosure.

For instance, in order to save space and realize the miniaturization of devices, the photoelectric converting element, the storage capacitor and the energy storage battery may adopt the setting mode of vertical layout. As illustrated in FIG. 8, the power supply assembly comprises a photoelectric converting element 100, a storage capacitor 200, an energy storage battery 300 and a base substrate 500. The photoelectric converting element 100, the storage capacitor 200 and the energy storage battery 300 are disposed on each other on the base substrate 500.

Figure 9:
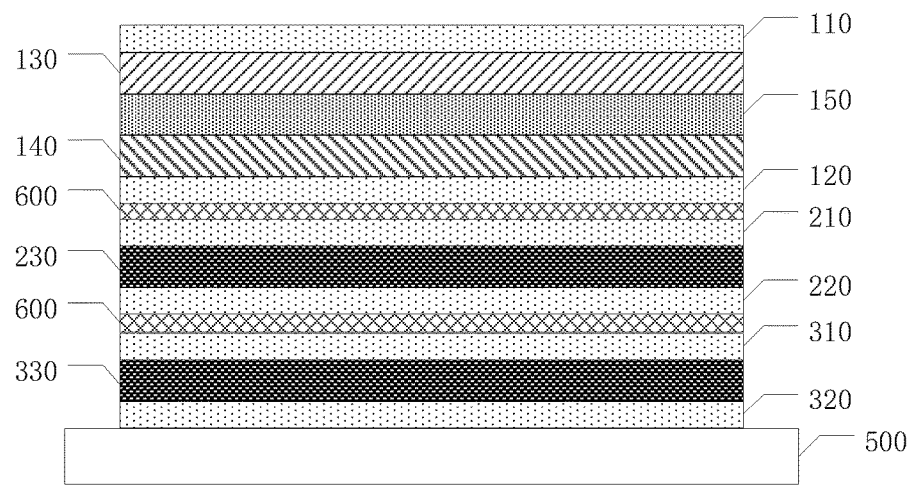
FIG. 9 is a schematic diagram of a fourth power supply assembly provided by an embodiment of the present disclosure.

For instance, the photoelectric converting element may be disposed on the top of the superimposed structure for the convenience of receiving external light. For instance, the energy storage battery 300, the storage capacitor 200 and the photoelectric converting element 100 may be disposed on the base substrate 500 sequentially as shown in FIG. 8. In addition, in order to avoid short circuits between each other, an insulating layer 600 may also be disposed between the energy storage battery and the storage capacitor, and between the storage capacitor and the photoelectric converting element. The structure is as shown in FIG. 9. In the power supply assembly, the base substrate 500 may be a glass substrate and may also be other substrates (e.g., a silicon wafer, or a flexible polyethylene terephthalate (PET) substrate). The material of the insulating layer 600 may be $SiN_x$; the material of the cathode layer 320 of the energy storage battery may be $LiCoO_2$. The electrolyte in the second electrolyte layer 330 may be LiPON. The material of the anode layer 310 may be Li. The material of the cathode layer 220 of the storage capacitor may be Al. The electrolyte in the first electrolyte layer 230 includes $Al_2O_3$ and $PbWO_3$. The material of the anode layer 210 is Al. The material of the cathode layer 120 of the photoelectric converting element may be ITO. The material of the p-type semiconductor layer 140 is p-type a-Si. The material of the i-type semiconductor layer 150 is i-type a-Si. The material of the n-type semiconductor layer 130 is n-type a-Si. The material of the anode layer 110 is Al or ITO.

Figure 10:
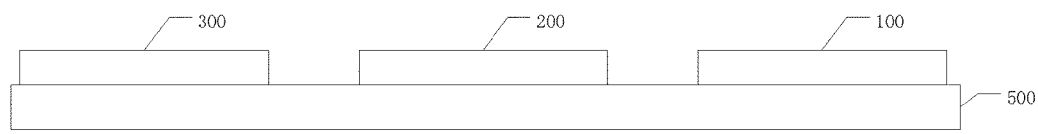
FIG. 10 is a schematic diagram of a fifth power supply assembly provided by an embodiment of the present disclosure.

In addition, the photoelectric converting element, the storage capacitor and the energy storage battery may adopt the setting mode of horizontal layout as shown in FIG. 10. The power supply assembly comprises a photoelectric converting element 100, a storage capacitor 200, an energy storage battery 300 and a base substrate 500. The photoelectric converting element 100, the storage capacitor 200 and the energy storage battery 300 are arranged in a same layer and disposed on the base substrate 500. Compared with the power supply assembly in FIG. 8, the power supply assembly provided by the embodiment has better bending and folding performances.

The power supply assembly provided by the embodiments of the present disclosure integrates the photoelectric converting element, the storage capacitor and the energy storage battery, and the three power supply devices respectively include two groups of independent cathode and anode interfaces. By adoption of the above connection means, the photoelectric converting element may be taken as a total energy source and used for charging the storage capacitor and the energy storage battery. Moreover, when the photoelectric converting element fails to work, the storage capacitor charges the energy storage battery. By adoption of the above means, the power supply time can be effectively prolonged in case of no light illumination, and uninterrupted power supply can be achieved in a case having light illumination.

The power supply assembly provided by the embodiment of the present disclosure comprises the photoelectric converting element capable of performing photoelectric conversion, the storage capacitor for the temporary storage of electricity energy, and the energy storage battery for the long-term storage of electricity energy, and can allow a long-term and stable power supply for devices for information gathering or communication on terminals of the Internet of things under the management of the energy management module. Meanwhile, as the thin-film structure is adopted, the power supply assembly can achieve the light and thin design of products and meet the characteristic of high mobility of the terminals of the Internet of things.

The power supply assembly provided by the embodiments of the present disclosure comprises a photoelectric converting element, a storage capacitor and an energy storage battery. The photoelectric converting element may convert received optical energy (e.g., sunlight) into electric energy under the control of the energy management module, and the electric energy obtained after conversion not only can supply power for electrical parts but also can charge the storage capacitor and the energy storage battery. In addition, when the photoelectric converting element cannot operate (e.g., in rainy weather or at night), the storage capacitor may charge the energy storage battery while supplying power for the electrical parts, so as to achieve a long-term and stable power supply for the electrical parts.

In addition, the embodiment of the present disclosure also provides an electronic device, which comprises the foregoing power supply assembly. For instance, the electronic device may be a device for information gathering or communication on a terminal of the Internet of things, e.g., a sensor, a radio-frequency identification (RFID) device or a near filed communication (NFC) device.

The described above are only embodiments of the present disclosure for explaining the present disclosure, and the present disclosure is not intended to be limited thereto. For one of ordinary skill in the art, changes and variations may be made without departing from the spirit and technical scope of the present disclosure, and all of these changes and variations shall fall within the scope of the present disclosure.

The application claims priority to the Chinese patent application No. 201610055608.3, filed with China's State Intellectual Property Office (SIPO) on Jan. 27, 2016 and entitled "Power Supply Assembly and Electronic Device", which is incorporated herein by reference in its entirety.

What is claimed is:

1. A power supply assembly, comprising a photoelectric converting element, a storage capacitor, an energy storage battery and an energy management module, wherein the energy management module is configured to control the photoelectric converting element to charge the storage capacitor and the energy storage battery, and control the storage capacitor to charge the energy storage battery.

2. The power supply assembly according to claim 1, wherein the energy management module comprises a detecting unit, a first switching unit, a second switching unit, a third switching unit and a control unit;

the detecting unit is configured to detect an output voltage of the photoelectric converting element, a dump energy of the storage capacitor, and a dump energy of the energy storage battery; and the control unit is configured to control the photoelectric converting element to charge the energy storage battery through the first switching unit when the output voltage of the photoelectric converting element is greater than a first default value and the dump energy of the energy storage battery is less than a second default value, control the photoelectric converting element to charge the storage capacitor through the second switching unit when the output voltage of the photoelectric converting element is greater than the first default value and the dump energy of the storage capacitor is less than a third default value, and control the storage capacitor to charge the energy storage battery through the third switching unit when a stored power of the storage capacitor is greater than a fourth default value and the dump energy of the energy storage battery is less than the second default value, in which the fourth default value is less than the third default value.

3. The power supply assembly according to claim 2, wherein anodes of the photoelectric converting element comprise a first anode and a second anode which are insulated from each other, and cathodes of the photoelectric converting element comprise a first cathode and a second cathode which are insulated from each other;

anodes of the storage capacitor comprise a third anode and a fourth anode which are insulated from each other, and cathodes of the storage capacitor comprise a third cathode and a fourth cathode which are insulated from each other;

anodes of the energy storage battery comprise a fifth anode and a sixth anode which are insulated from each other, and cathodes of the energy storage battery comprise a fifth cathode and a sixth cathode which are insulated from each other;

the first switching unit is configured to control at least one of an on-off action between the first anode and the fifth cathode, or an on-off action between the first cathode and the fifth anode; the second switching unit is configured to control at least one of an on-off action between the second anode and the fourth cathode, or an on-off action between the second cathode and the fourth anode; and the third switching unit is configured to control at least one of an on-off action between the third anode and the sixth cathode, or an on-off action between the third cathode and the sixth anode.

4. The power supply assembly according to claim 3, wherein the photoelectric converting element comprises a p-type semiconductor layer, an n-type semiconductor layer, and an i-type semiconductor layer disposed between the p-type semiconductor layer and the n-type semiconductor layer; the first anode and the second anode are disposed on a side of the n-type semiconductor layer away from the i-type semiconductor layer; and the first cathode and the second cathode are disposed on a side of the p-type semiconductor layer away from the i-type semiconductor layer.

5. The power supply assembly according to claim 4, wherein the first anode and the second anode are respectively comb-shaped and intersected with each other, and the first cathode and the second cathode are respectively comb-shaped and intersected with each other.

6. The power supply assembly according to claim 3, wherein the storage capacitor comprises a first electrolyte layer; the third anode and the fourth anode are disposed on a side of the first electrolyte layer; and the third cathode and the fourth cathode are disposed on another side of the first electrolyte layer.

7. The power supply assembly according to claim 6, wherein the third anode and the fourth anode are respectively comb-shaped and intersected with each other; and the third cathode and the fourth cathode are respectively comb-shaped and intersected with each other.

8. The power supply assembly according to claim 3, wherein the energy storage battery comprises a second electrolyte layer; the fifth anode and the sixth anode are disposed on a side of the second electrolyte layer; and the fifth cathode and the sixth cathode are disposed on another side of the second electrolyte layer.

9. The power supply assembly according to claim 8, wherein the fifth anode and the sixth anode are respectively comb-shaped and intersected with each other; and the fifth cathode and the sixth cathode are respectively comb-shaped and intersected with each other.

10. The power supply assembly according to claim 3, wherein the first anode and the second anode are respectively comb-shaped and intersected with each other, and the first cathode and the second cathode are respectively comb-shaped and intersected with each other.

11. The power supply assembly according to claim 1, further comprising a base substrate, wherein the photoelectric converting element, the storage capacitor and the energy storage battery are disposed on the base substrate.

12. The power supply assembly according to claim 11, wherein the photoelectric converting element, the storage capacitor and the energy storage battery are disposed on each other on the base substrate.

13. The power supply assembly according to claim 12, wherein the energy storage battery, the storage capacitor and the photoelectric converting element are disposed on the base substrate in sequence.

14. The power supply assembly according to claim 13, wherein an insulating layer is respectively disposed between the energy storage battery and the storage capacitor, and between the storage capacitor and the photoelectric converting element.

15. The power supply assembly according to claim 11, wherein the photoelectric converting element, the storage capacitor and the energy storage battery are disposed in a same layer on the base substrate.

16. An electronic device, comprising the power supply assembly according to claim 1.

17. The power supply assembly according to claim 1, wherein anodes of the photoelectric converting element comprise a first anode and a second anode which are insulated from each other, and cathodes of the photoelectric converting element comprise a first cathode and a second cathode which are insulated from each other;

anodes of the storage capacitor comprise a third anode and a fourth anode which are insulated from each other, and cathodes of the storage capacitor comprise a third cathode and a fourth cathode which are insulated from each other;

anodes of the energy storage battery comprise a fifth anode and a sixth anode which are insulated from each other, and cathodes of the energy storage battery comprise a fifth cathode and a sixth cathode which are insulated from each other;

a first switching unit is configured to control at least one of an on-off action between the first anode and the fifth cathode, or an on-off action between the first cathode and the fifth anode; a second switching unit is configured to control at least one of an on-off action between the second anode and the fourth cathode, or an on-off action between the second cathode and the fourth anode; and a third switching unit is configured to control at least one of an on-off action between the third anode and the sixth cathode, or an on-off action between the third cathode and the sixth anode.

18. The power supply assembly according to claim 1, wherein the photoelectric converting element comprises a p-type semiconductor layer, an n-type semiconductor layer, and an i-type semiconductor layer disposed between the p-type semiconductor layer and the n-type semiconductor layer; a first anode and a second anode are disposed on a side of the n-type semiconductor layer away from the i-type semiconductor layer; and a first cathode and a second cathode are disposed on a side of the p-type semiconductor layer away from the i-type semiconductor layer.

* * * * *